United States Patent
Lee

(10) Patent No.: US 9,564,200 B2
(45) Date of Patent: Feb. 7, 2017

(54) PILLAR-TYPE FIELD EFFECT TRANSISTOR HAVING LOW LEAKAGE CURRENT

(75) Inventor: Jong-Ho Lee, Seoul (KR)

(73) Assignee: SNU R&DB FOUNDATION, Seoul (KR)

( * ) Notice: Subject to any disclaimer, the term of this patent is extended or adjusted under 35 U.S.C. 154(b) by 1265 days.

(21) Appl. No.: 13/010,360

(22) Filed: Jan. 20, 2011

(65) Prior Publication Data

US 2011/0121396 A1 May 26, 2011

Related U.S. Application Data

(63) Continuation-in-part of application No. 12/101,143, filed on Apr. 10, 2008, now abandoned.

(30) Foreign Application Priority Data

Apr. 10, 2007 (KR) ........................ 10-2007-0035277

(51) Int. Cl.
*H01L 29/66* (2006.01)
*G11C 11/403* (2006.01)
(Continued)

(52) U.S. Cl.
CPC ....... *G11C 11/403* (2013.01); *H01L 27/10876* (2013.01); *H01L 29/42392* (2013.01);
(Continued)

(58) Field of Classification Search
CPC ............. G11C 11/403; H01L 27/10876; H01L 29/42392; H01L 29/7827; H01L 29/7831; H01L 29/78642; H01L 29/78648
(Continued)

(56) References Cited

U.S. PATENT DOCUMENTS

2003/0209761 A1* 11/2003 Yagishita ................ H01L 21/84
257/347
2004/0183119 A1* 9/2004 Negoro ............. H01L 21/82345
257/314
(Continued)

FOREIGN PATENT DOCUMENTS

| JP | 5-75132 A | 3/1993 |
| KR | 10-2005-0019468 A | 3/2005 |
| KR | 10-0660891 B1 | 12/2006 |

OTHER PUBLICATIONS

Kim, J.Y. et al., "The Breakthrough in data retention time of DRAM using Recess-Channel-Array Transistor(RCAT) for 88nm feature size and beyond", 2003 Symposium on VLSI Technology Digest of Technical Papers, 2003, pp. 11-12.

*Primary Examiner* — Vongsavanh Sengdara
(74) *Attorney, Agent, or Firm* — Cantor Colburn LLP

(57) ABSTRACT

A pillar-type field effect transistor having low leakage current is provided. The pillar-type field effect transistor includes: a semiconductor body, source and drain formed in a semiconductor pillar; a gate insulating layer formed on a surface of the semiconductor body; a gate electrode formed on a surface of the gate insulating layer. The gate electrode includes a first gate electrode and a second gate electrode being electrically connected with the first gate electrode. The first gate electrode has a work function higher than that of the second gate electrode. Accordingly, the gate induced drain leakage (GIDL) can be reduced, so that an off-state leakage current can be greatly reduced.

17 Claims, 11 Drawing Sheets

(51) Int. Cl.
*H01L 27/108* (2006.01)
*H01L 29/423* (2006.01)
*H01L 29/78* (2006.01)
*H01L 29/786* (2006.01)

(52) U.S. Cl.
CPC ...... *H01L 29/7827* (2013.01); *H01L 29/7831* (2013.01); *H01L 29/78642* (2013.01); *H01L 29/78648* (2013.01)

(58) Field of Classification Search
USPC .......................................... 257/365, E29.264
See application file for complete search history.

(56) References Cited

U.S. PATENT DOCUMENTS

| | | | |
|---|---|---|---|
| 2006/0097310 A1* | 5/2006 | Kim | H01L 21/28282 257/321 |
| 2007/0034972 A1* | 2/2007 | Chau | B82Y 10/00 257/401 |
| 2007/0228491 A1* | 10/2007 | Forbes | H01L 29/0657 257/401 |

* cited by examiner (a)     (b)

(a)

(b)

(a)

(b)

(c)

(d)

PILLAR-TYPE FIELD EFFECT TRANSISTOR HAVING LOW LEAKAGE CURRENT

CROSS-REFERENCE TO RELATED PATENT APPLICATION

This application is a continuation-in-part of U.S. patent application Ser. No. 12/101,143, filed on Apr. 10, 2008, in the name of Jong-Ho LEE. This application claims the benefit of Korean Patent Application No. 10-2007-0035277, filed on Apr. 10, 2007, in the Korean Intellectual Property Office, the disclosure of which is incorporated herein in its entirety by reference.

BACKGROUND OF THE INVENTION

1. Field of the Invention

The present invention relates to a pillar-type field effect transistor having low leakage current, and more particularly, to a pillar-type field effect transistor capable of reducing gate induced drain leakage by forming a semiconductor body on a semiconductor substrate and forming a plurality of gate electrodes having different work functions so as to lower a work function of a gate electrode in a region overlapped with a drain region.

2. Description of the Related Art

DRAM technology has been one of the important technologies in silicon semiconductor markets. Recently, the DRAM technology has been more actively researched to implement next-generation highly-integrated DRAMs. In particular, a gate length of a DRAM cell device has been designed to be further reduced according to miniaturization of cell devices and an increase in a degree of integration of cell devices. As a problem in the miniaturization of cell devices, there is a so-called short channel effect problem. Due to the short channel effect, an off-state drain current is increased.

In a conventional MOSFET (Metal-Oxide-Semiconductor Field Effect Transistor), a channel region is formed in a planar surface, and source/drain regions are formed on both sides of the channel region. If the conventional MOSFET having the planar channel region is adapted to a sub-100 nm DRAM technology, the aforementioned short channel effect problem becomes serious. In general, in the miniaturization of the MOSFET, a thickness of a gate insulating layer and a depth of source/drain junction need be reduced, and a doping concentration of the channel region needs to be increased. In comparison with a Logic MOSFET, in the MOSFET for a DRAM cell device, the thickness of the gate insulating layer cannot be greatly reduced in terms of device characteristics, and the depth of the source/drain regions cannot be greatly deepened. Therefore, the miniaturization of the DRAM cell device is difficult. In addition, in order to prevent the so-called DIBL (Drain Induced Barrier Lowering) involved with the miniaturization of the DRAM cell device, the doping concentration of the channel region needs to be increased. In this case, a field between the channel region and the drain region is increased, and a leakage current due to band-to-band tunneling is increased. In the DRAM cell device, the leakage current, that is, an off-state drain current needs to be limited to about 1 fA or less. Therefore, in the conventional MOSFET having the planar channel, it is very difficult to reduce the gate length of the cell device down to about 70 nm or less.

Recently, approaches for solving the problems in the conventional DRAM cell device having the planar channel have actively researched. As an approach, a three-dimensional device structure or a device structure having a non-planar channel has been researched. As representative devices for the DRAM cell device, there are a device having a buried channel structure and a bulk FinFET, of which characteristics are described below.

In the DRAM cell device, it is important to decrease a cell area in a two-dimensional surface and to increase an on-state current and decrease an off-state current. In the buried channel structure, by preventing an increase in the cell area in the two-dimensional surface and increasing an effective channel length, the short channel effect such as DIBL can be suppressed. As an example, a buried channel structure adapted to a DRAM cell device was proposed by SAMSUNG ELECTRONIC CO. (J. Y. Kim et al., The breakthrough in data retention time of DRAM using recess-channel-array transistor (RCAT) for 88 nm feature size and beyond, in Proc. Symp. on VLSI Tech., p. 11, 2003). Although the off-state current can be greatly decreased by suppression of the short channel effect, the on-state current is also greatly decreased due to a relatively long channel length and a relatively short width of channel. Due to the decrease in the on-state current, operating speed of the DRAM is lowered. In addition, since a channel formed in the vicinity of a bottom of a buried region is formed in a concave shape, a problem of a back-bias effect become serious. In addition, any change in doping concentration of the channel region in the vicinity of the bottom causes a great change in a threshold voltage. In general, in the buried channel structure, the doping concentration is increased in only the buried channel region. In this case, the doping concentration influences the corner regions. In addition, in the ministration of device, a width of the buried channel region is reduced, so that it is difficult to control an etching profile in the vicinity of the bottom of the buried channel region and to maintain a uniform depth of the buried channel region. In addition, due to the reduction of the width of the buried channel region and the corresponding change in the etching profile in the vicinity of the bottom of the buried channel region, a sensitivity of the threshold voltage is increased.

In a double/triple-gate MOSFET where a gate surrounds a channel region, an excellent controllability of the gate electrode to the channel can be obtained. However, the double/triple-gate MOSFET formed on a SOI substrate, that is, an SOI FinFET cannot be substantially adapted to a DRAM cell device due to its device characteristics. The inventor of the present invention firstly proposed a body-tied double/triple-gate MOSFET (see Korean Patent Nos. 0458288 and 0471189, U.S. Pat. No. 6,885,055, Japanese Patent Application No. 2003-298051, U.S. patent application Ser. No. 10/358,981, and Japanese Patent Application No. 2002-381448), which is referred as a bulk fin field effect transistor (bulk FinFET). In the bulk FinFET, a channel is not buried, but the channel is formed in an upper surface and both side surfaces of a fence-shaped body. Alternatively, the channel is formed in both side surfaces of the fence-shaped body. As a result, the controllability of the gate electrode to the channel is much greater than that of the conventional device having the planar channel structure. In the bulk FinFET, the short channel effect can be effectively suppressed, and the DIBL becomes small, so that the miniaturization of device can be effectively implemented. Due to the excellent controllability of the gate electrode of the channel, there is substantially no influence of substrate bias. Since the cell area in two-dimensional surface is small and the effective channel width can be effectively increased, the on-state current can be increased, so that the operating speed of the DRAM can be increased. Therefore, a DRAM cell device employing the bulk FinFET can obtain many advantages.

In general, in an n-type FinFET, an n⁺ polysilicon gate is used. In this case, since the threshold voltage of a device is decreased, there is a problem in that the off-state current is increased. In order to increase the threshold voltage, a doping concentration for the channel region may be increased. However, the increase in the doping concentration causes an increase in the leakage current due to the band-to-band tunneling between the drain region and the channel region. There is a limitation in increasing the doping concentration for the channel region. In order to solve the problem, a negative word-line scheme may be used. However, there is a problem in that peripheral circuits become complicated. Alternatively, in order to increase the threshold voltage, the work function of the gate electrode may be changed by replacing the doping type of n⁺ with the doping type of p⁺. However, in this case, an energy band curvature in an overlapped portion between the gate electrode and the drain region is increased, so that the GIDL current is increased. As a result, there is a problem in that the off-state current is increased.

Therefore, the present invention proposes a new device structure capable of obtaining a suitable threshold voltage and a leakage current of 1 fA or less per cell by suppressing the GIDL in a pillar-type device.

SUMMARY OF THE INVENTION

The present invention provides to a pillar-type field effect transistor having a reduced area of cell device, having a good miniaturization characteristic, and minimizing an off-state leakage current to be used as a highly-integrated DRAM cell.

The present invention also provides to a pillar-type FET capable of increasing a threshold voltage of device and GIDL (gate induced drain leakage) by adjusting a work function of a gate of the pillar-type FET.

The present invention also provides to a pillar-type FET capable of obtaining an excellent degree of device integration and reducing an off-state leakage current by adjusting a cross-sectional area of a semiconductor body and a thickness of a gate insulating layer.

According to a first aspect of the present invention, there is provided a pillar-type field effect transistor having low leakage current, comprising: a semiconductor body formed in a semiconductor pillar; a gate insulating layer formed on a surface of the semiconductor body; a gate electrode formed on a surface of the gate insulating layer; and source and drain regions formed in the semiconductor pillar and located at both sides of the semiconductor body, respectively; wherein the gate electrode includes a first gate electrode and a second gate electrode being electrically connected with the first gate electrode, wherein the first gate electrode has a work function higher than that of the second gate electrode, and wherein the first gate electrode and the second gate electrode are directly contacted with the gate insulating layer.

In the above first aspects, the second gate electrode is comprising of a couple of second gate electrodes, and a couple of second gate electrodes are located at both lateral walls of the first gate electrode, respectively. In addition, the pillar-type field effect transistor is further comprising inter-gate insulating layers are formed between the first gate electrode and the second gate electrodes.

In the above first aspects, the pillar-type field effect transistor is further comprising an inter-gate insulating layer formed between the first gate electrode and the second gate electrode. In addition, the first gate electrode and the second gate electrode are electrically connected to each other by a contact or metal interconnection line.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, pillar-type field effect transistors (FETs) having low leakage current according to various embodiments of the present invention and manufacturing methods therefor will be described in detail with reference to the accompanying drawings.

First Embodiment

Figure 1:
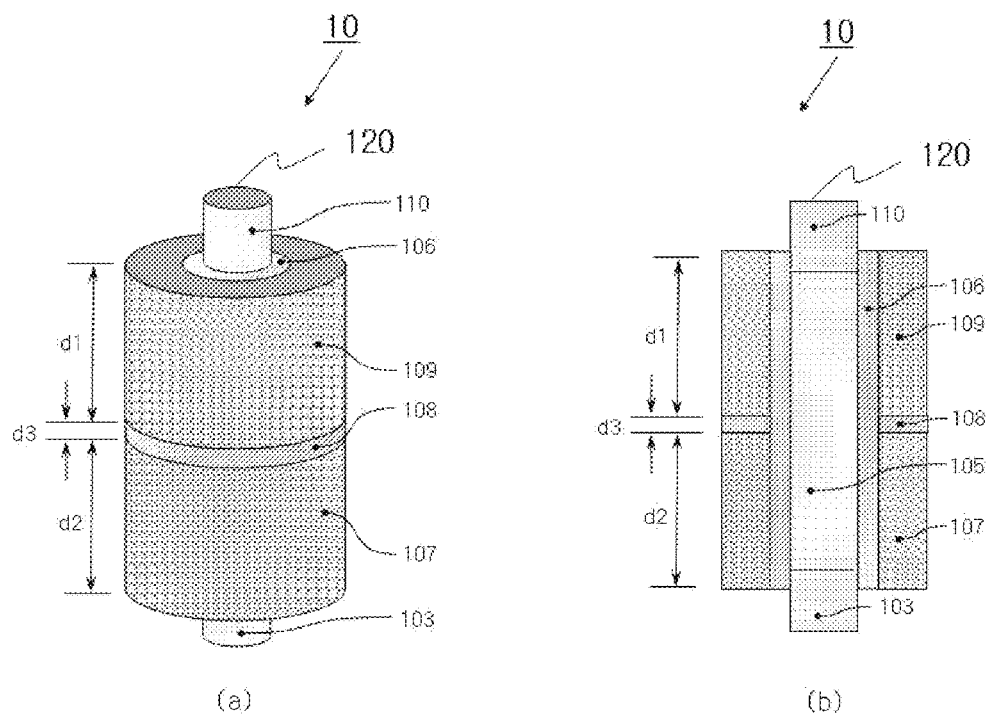
FIGS. 1 (a) and (b) are perspective and cross-sectional views illustrating only main components of a pillar-type FET according to a first embodiment of the present invention.

Hereinafter, a structure of a pillar-type FET having low leakage current according to a first embodiment of the present invention will be described with reference to FIG. 1. FIG. 1 illustrates the pillar-type FET having low leakage current according to the first embodiment of the present invention; and (a) and (b) are a perspective view and a cross-sectional view illustrating the pillar-type FET according to the first embodiment of the present invention, respectively. For the convenience of description, FIG. 1 illustrates only the main components excluding a semiconductor substrate, metal layers for interconnection of devices, contacts, and some insulating layers.

The pillar-type FET 10 according to the first embodiment of the present invention includes a source 103, a semiconductor body 105, a drain 110, a gate insulating layer 106, and a gate electrode. The gate electrode includes a first gate electrode 109, a second gate electrode 107, and an inter-gate insulating layer 108.

The source 103, the semiconductor body 105, and the drain 110 are formed in a semiconductor pillar 120 made of silicon. The semiconductor pillar may be formed on a semiconductor substrate such as a bulk silicon substrate and a silicon on insulator (SOI) substrate. The semiconductor pillar may be formed in various shapes such as circle, ellipse, corner-rounded rectangle, and corner-rounded triangle. A height of the semiconductor pillar is defined to be in a range of 50 nm to 1000 nm. A cross-sectional area of the semiconductor pillar in the horizontal direction may be formed to be uniform. Alternatively, the cross-sectional area of the semiconductor pillar may be increased or decreased in various functional forms in the upward direction. Alternatively, the cross-sectional area of the semiconductor pillar may be repetitively increased and decreased. Preferably, the cross-sectional area of the semiconductor pillar is defined to be in a range of 78 $nm^2$ to 130,000 $nm^2$.

A cross-sectional area of the semiconductor pillar may be gradually varied from upper edge to lower edge of the semiconductor pillar. A cross-sectional area of the semiconductor body surrounded by the second gate electrode may be smaller than that of the semiconductor body surrounded by the first gate electrode.

The gate insulating layer 106 is formed on a surface of the semiconductor body 105. Preferably, a thickness of the gate insulating layer 106 is defined to be in a range of 0.5 nm to 10 nm. A thickness of a gate insulating layer formed under the second gate electrode 109 may be gradually increased in a direction from the body 105 to the drain 110. A thickness of the gate insulating layer formed between the second gate electrode and the semiconductor body may be larger than that of the gate insulating layer formed between the first gate electrode and the semiconductor body.

The gate electrode of the pillar-type FET according to the first embodiment of the present invention includes the first gate electrode 107, the second gate electrode 109, and the inter-gate insulating layer 108, which have different work functions. As shown in FIG. 1, the first gate electrode 107 and the second gate electrode 109 are separated from each other by the inter-gate insulating layer 108. However, the first gate electrode 107 and the second gate electrode 109 are electrically connected to each other through a contact, a wire line or the like. A total length of the gate electrode is a sum of a length d1 of the first gate electrode 107, a length d2 of the second gate electrode 109, and a length d3 of the inter-gate insulating layer 108. Preferably, the total length of the gate electrode is defined to be in a range of 30 nm to 800 nm. The length d1 of the first gate electrode is defined to be in a range of 5 nm to 400 nm, and the length d2 of the second gate electrode is defined to be in a range of 5 nm to 400 nm. The length d3 of the inter-gate insulating layer is defined to be in a range of 0.1 nm to 20 nm.

The first gate electrode 107 is a source-side gate electrode which is made of a material having a work function higher than that of the second gate electrode 109. Therefore, a threshold voltage of the pillar-type FET according to the first embodiment of the present invention is mainly determined by the first gate electrode 107 having a high work function. The second gate electrode 109 is a drain-side gate electrode, of which work function is lower than that of the first gate electrode 107.

The first gate electrode 107 and the second gate electrode 109 may be made of the same material with different impurity-doping types so as to lower the work function of the second gate electrode 109. In addition, the first gate electrode 107 and the second gate electrode 109 may be made of different materials so as to lower the work function of the second gate electrode 109. In addition, in an example of the gate electrode according to the first embodiment of the present invention, the first gate electrode 107 and the second gate electrode 109 may be made of different materials with different impurity-doping types so that the work function of the second gate electrode 109 can be lower than that of the first gate electrode 107.

The first and second gate electrodes 107 and 109 may be formed by using a semiconductor material such as polycrystalline silicon, polycrystalline SiGe, polycrystalline Ge, amorphous silicon, amorphous SiGe, amorphous Ge, silicon, and Ge, one of silicides of various metals, one of various metal oxides, one of metals having various work functions, a two-element metal such as TaN, TiN, and WN, and a three-element metal.

Lengths of the source/drain regions 103 and 110 formed in the semiconductor pillar 120 are defined in a direction perpendicular to an upper surface of the semiconductor pillar. The length of the source or drain region is defined to be in a range of 5 nm to 700 nm. In a case where the source/drain regions 103 and 110 are overlapped with the gate electrodes 107 and 109, each of the overlapped lengths is defined to be in a range of 0.1 nm to 50 nm.

In the source or drain region formed in an upper portion of the semiconductor pillar 120, a cross-sectional area of the source or drain region excluding a vicinity of the gate electrode may be formed to be lager than that of the body region 105 so as to reduce resistance. In order to increase the cross-sectional area of the drain region 110 formed in the semiconductor pillar 120, a selective epitaxial layer may be grown on a surface of the semiconductor pillar where the drain region is formed. In addition, in a case where a contact window for electrical contact to the drain region 110 formed in the semiconductor pillar 120 is formed, an area of the contact window is formed to be larger than the cross-sectional area of the semiconductor pillar 120 where the drain 110 is formed, so that the cross section of the semiconductor pillar 120 and a portion of the side surface of the semiconductor pillar 120 where the drain 110 is formed can be in contact with the electrode. Accordingly, a contact area of contacting the electrode can be increased.

In the pillar-type FET according to the present invention, since the work function of the second gate electrode 109 is smaller than that of the first gate electrode 107, an electrical field in the drain region overlapped with the second gate electrode can be reduced, and an electric field toward the source due to a drain bias can be also reduced. As a result, it is possible to reduce gate induced drain leakage (GIDL), which is one of the objects of the present invention. In addition, since the electrical field due to the drain voltage can be reduced, an occurrence of hot carriers can be suppressed, so that it is possible to improve durability of device.

FIG. 1 (a) is a longitudinal cross-sectional view illustrating a vertically-cut central portion of the semiconductor pillar of FIG. 1 (a). The thickness of the gate insulating layer 106 is formed to be uniform along the semiconductor pillar. On the other hand, in another example of the gate insulating layer of the pillar-type FET according to the present invention, in a region where the second gate electrode 109 and the drain region 110 are overlapped with each other, a thickness of the gate insulating layer 106 is increased in a direction from the body 105 to the drain region 110, so that the GIDL can be reduced.

Figure 2:
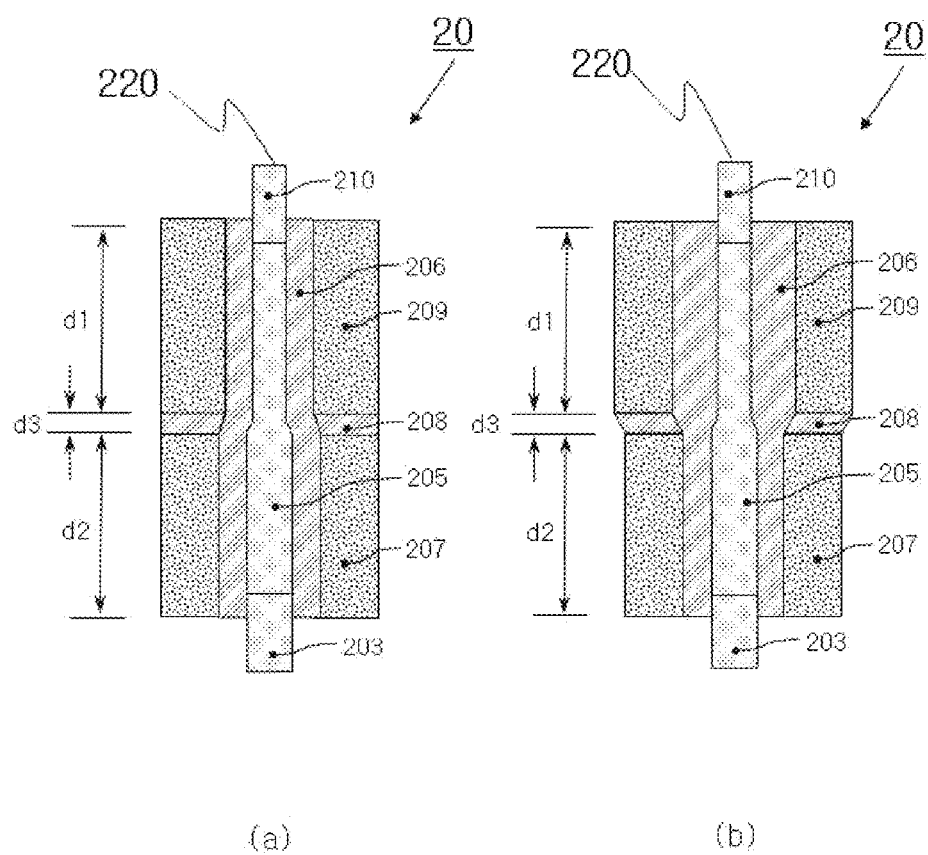
FIG. 2 illustrates main components of a pillar-type FET having low leakage current according to a second embodiment of the present invention, (a) is a cross-sectional view illustrating a device where a diameter of a body under a second gate electrode is smaller than that of a body under a first gate electrode, and (b) is a cross-sectional view illustrating a device where a thickness of a gate insulating layer under the second gate electrode is larger than a gate insulating layer under the first gate electrode.

In FIG. 1, when the first gate electrode 107 and the second gate electrode 109 are formed, the first gate electrode 107 may be firstly formed, the inter-gate insulating layer 108 may be formed, and after that, the second gate electrode 109 may be formed Second Embodiment Hereinafter, a structure of a pillar-type FET having low leakage current according to a second embodiment of the present invention will be described with reference to FIG. 2. FIG. 2 illustrates the pillar-type FET having low leakage current according to the second embodiment of the present invention; and (a) and (b) are cross-sectional views illustrating first and second examples of the pillar-type FET according to the second embodiment, respectively. For the convenience of description, FIG. 2 illustrates only the main components excluding a semiconductor substrate, metal layers for interconnection of devices, contacts, and some insulating layers.

The pillar-type FET according to the second embodiment is the same as the pillar-type FET according to the first embodiment except for a thickness of a gate insulating layer and a width of a semiconductor pillar. Referring to FIG. 2 (a), in the pillar-type FET according to the second embodiment, a width of the semiconductor pillar 220 under a second gate electrode 209 and a width of the semiconductor pillar 220 under a drain region 210 is formed to be smaller than a width of the semiconductor pillar 220 in other portions.

On the other hand, referring to FIG. 2 (b), in another example of the pillar-type FET according to the second embodiment, unlike the pillar-type FET according to the first embodiment, the width of the semiconductor pillar under the second gate electrode 209 and the width of the semiconductor pillar in the drain region 210 are formed to be smaller that a width of the semiconductor pillar in other portions, and a thickness of the gate insulating layer 206 formed under the second gate electrode 209 is formed to be larger than that of the gate insulating layer formed under the first gate electrode 207. Similar to the pillar-type FET according to the first embodiment, in the pillar-type FET according to the second embodiment, the thickness of the gate insulating layer 206 is increased in a direction from a body region 205 to the drain region 210, so that it is possible to further reduce the GIDL.

If the width of the semiconductor pillar where the drain region 210 overlapped with the second gate electrode 209 is formed is decreased, parasitic resistance is increased. Therefore, in order to increase an ON current of a device, resistance may be reduced by performing the selective epitaxial layer growth as described above.

Third Embodiment

Figure 3:
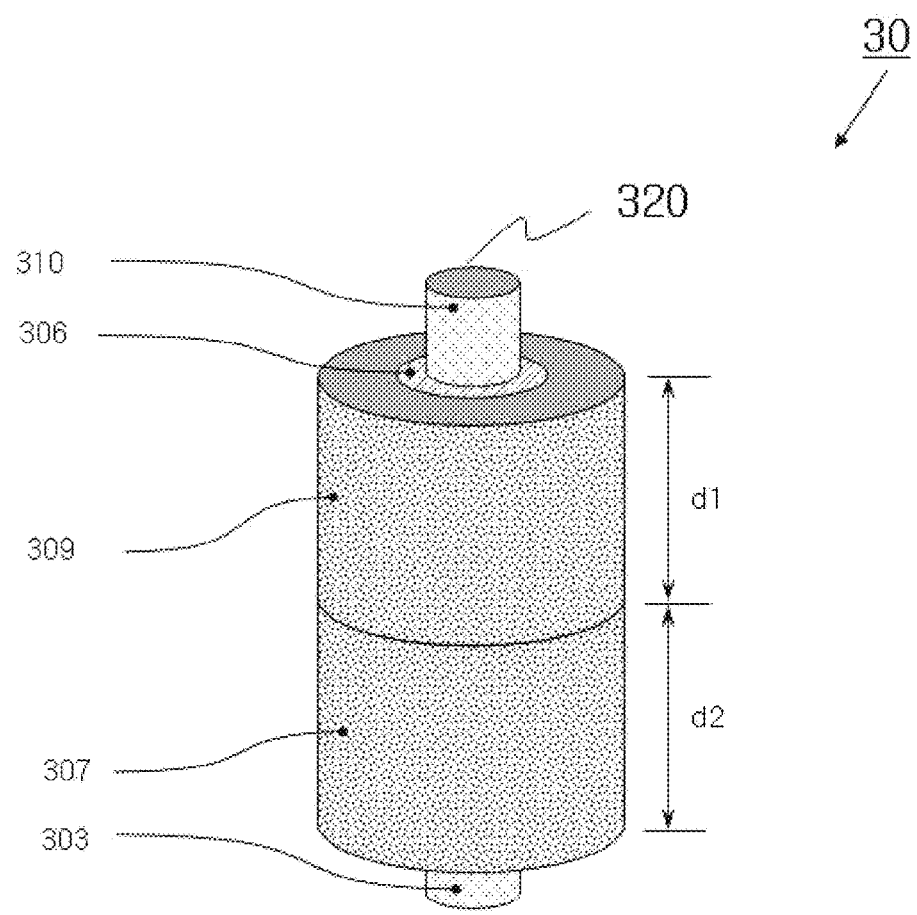
FIG. 3 is a perspective view illustrating a pillar-type FET according to a third embodiment of the present invention.

Hereinafter, a structure of a pillar-type FET having low leakage current according to a third embodiment of the present invention will be described with reference to FIG. 3. FIG. 3 is a perspective view illustrating the pillar-type FET according to the third embodiment of the present invention. For the convenience of description, FIG. 3 illustrates only the main components excluding a semiconductor substrate, metal layers for interconnection of devices, contacts, and some insulating layers.

Referring to FIG. 3, the pillar-type FET 30 according to the third embodiment is implemented by modifying only the gate electrode of the pillar-type FET according to the first embodiment. More specifically, the pillar-type FET according to the third embodiment is implemented by removing an inter-gate insulating layer between the first gate electrode 307 and the second gate electrode 309. Structures and characteristics of other components of the pillar-type FET 30 according to the third embodiment are the same as those of the first embodiment.

In the pillar-type FET 30 according to the third embodiment, when the first gate electrode 309 and the second gate electrode 307 are formed, the first gate electrode 309 is firstly formed, and the second gate electrode 307 having different work function is formed thereon. Alternatively, the first gate electrode 309 and the second gate electrode may be formed by forming $p^+$ polysilicon and counter-doping the resulting product with impurities $n^+$. A total length of the gate electrode is a sum of a length d1 of the first gate electrode 309 and a length d2 of the second gate electrode 307.

Fourth and Fifth Embodiments

Figure 4:
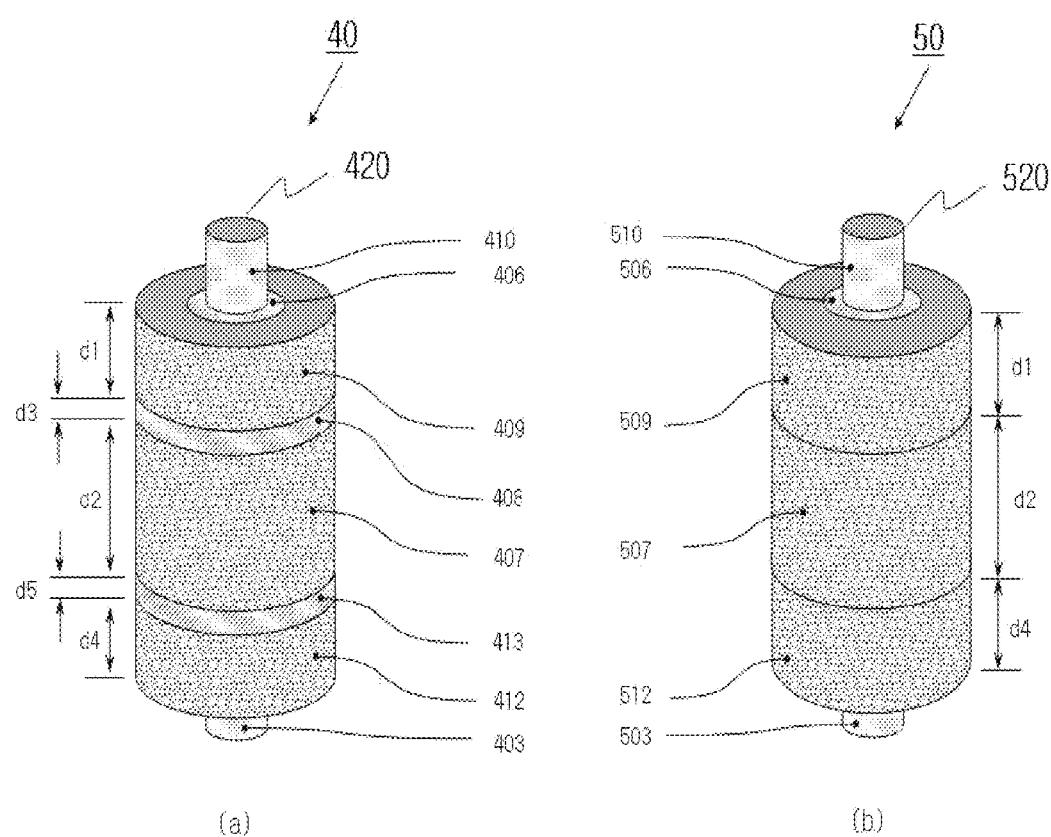
FIG. 4 illustrates main components of a pillar-type FET having low leakage current according to a fourth embodiment of the present invention, (a) is a perspective view illustrating main components of a pillar-type FET having three gate electrodes which are separated from each other in structure, and (b) is a perspective view illustrating main components of a pillar-type FET having three gate electrodes which are connected to each other in structure.

Hereinafter, structures of pillar-type FETs having low leakage current according to fourth and fifth embodiments of the present invention will be described with reference to FIGS. 4 (a) and (b). FIG. 4 (a) is a perspective view illustrating the pillar-type FET according to the fourth embodiment of the present invention. FIG. 4 (b) is a perspective view illustrating the pillar-type FET according to the fifth embodiment of the present invention.

In the pillar-type FET 40 according to the fourth embodiment, a third gate electrode 412 is further provided to the structure of the pillar-type FET according to the first embodiment. That is, the pillar-type FET 40 according to the fourth embodiment is different from the first embodiment in terms of the only the structure of the gate electrode. Therefore, the gate electrode of the pillar-type FET 40 according to the fourth embodiment includes a first gate electrode 407, a second gate electrode 409, a third gate electrode 412, a first inter-gate insulating layer 408, and a second inter-gate insulating layer 413. The first inter-gate insulating layer 408 is formed between the first gate electrode 407 and the second gate electrode 409, and the second inter-gate insulating layer 413 is formed between the first gate electrode 407 and the third gate electrode 412. The structure of the fourth embodiment is the same as that of the first embodiment except for the gate structure.

In the pillar-type FET 50 according to the fifth embodiment, a third gate electrode 512 is further provided to the structure of the pillar-type FET according to the third embodiment. That is, the pillar-type FET 50 according to the fifth embodiment is different from the third embodiment in terms of the only the structure of the gate electrode. Therefore, the gate electrode of the pillar-type FET 50 according to the fifth embodiment includes a first gate electrode 507, a second gate electrode 509, and a third gate electrode 512. The structure of the fifth embodiment is the same as that of the third embodiment except for the gate structure.

In the pillar-type FETs according to the fourth and fifth embodiments, the third gate electrode 412 (512) formed below the first gate electrode 407 (507) is formed to have a work function lower than that of the first gate electrode 407 (507), so that relatively similar characteristics can be obtained when the source and drain are exchanged. A length d4 of the third gate electrode 412 (512) is defined to be in a range of 5 nm to 400 nm. In the pillar-type FET according to the fourth embodiment, a thickness d5 of the second inter-gate insulating layer formed between the first gate electrode 407 and the third gate electrode 412 is defined in a range of 0.1 nm to 20 nm.

DRAM Cell Array Using Pillar-Type FETs

Figure 5:
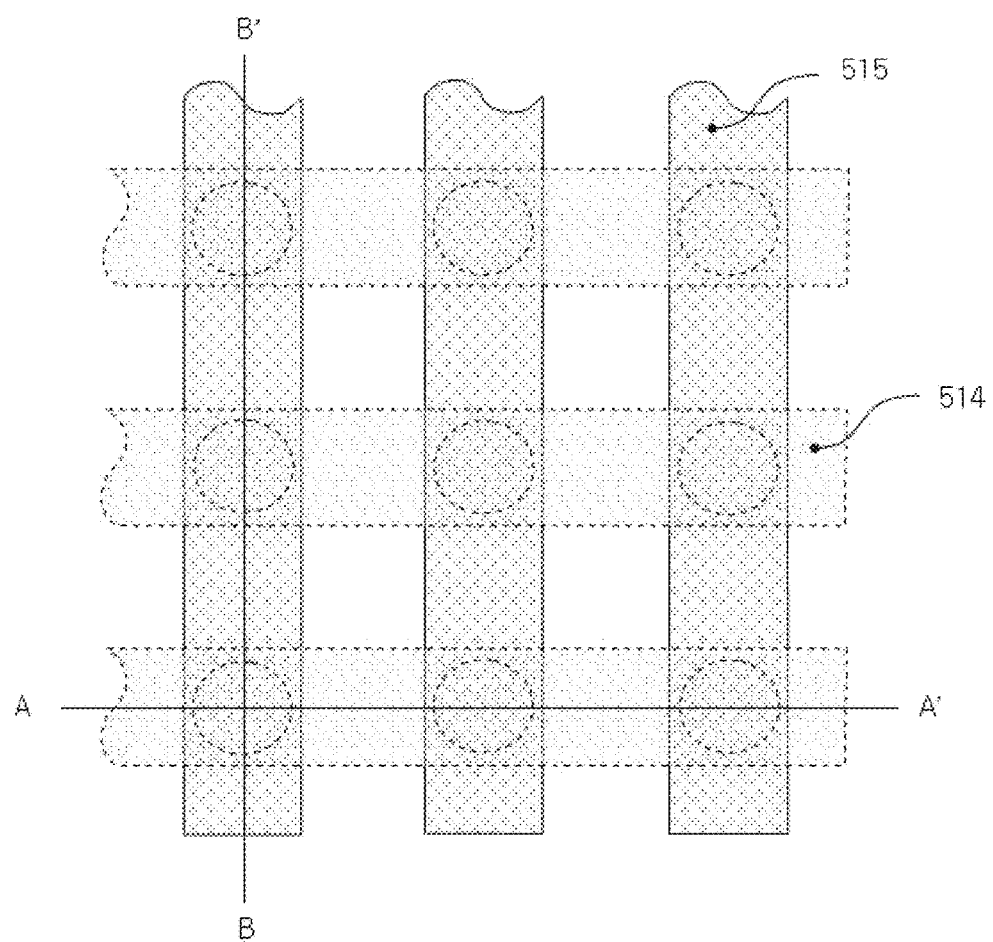
FIG. 5 is a plan view illustrating a layout of work lines and bit lines in a DRAM cell array implemented by using pillar-type FETs according to the present invention.

Hereinafter, a structure of a DRAM cell array using the pillar-type FETs according to the aforementioned embodiments of the present invention will be described in detail. FIG. 5 illustrates a layout of word lines 514 and bit lines 515 used for implementing the DRAM cell array using the pillar-type FETs according the present invention. Dotted circles schematically denote the semiconductor pillars.

In a case where the DRAM cell array is formed by using the pillar-type FETs according to the aforementioned first to fifth embodiments, a capacitor for storing charges in each cell may be formed on an upper or lower portion of each of semiconductor pillars 120, 220, 320, 420, and 520. Therefore, positions of the source and drain regions formed in each semiconductor pillar shown in FIGS. 1 to 4 may be exchanged.

Figure 6:
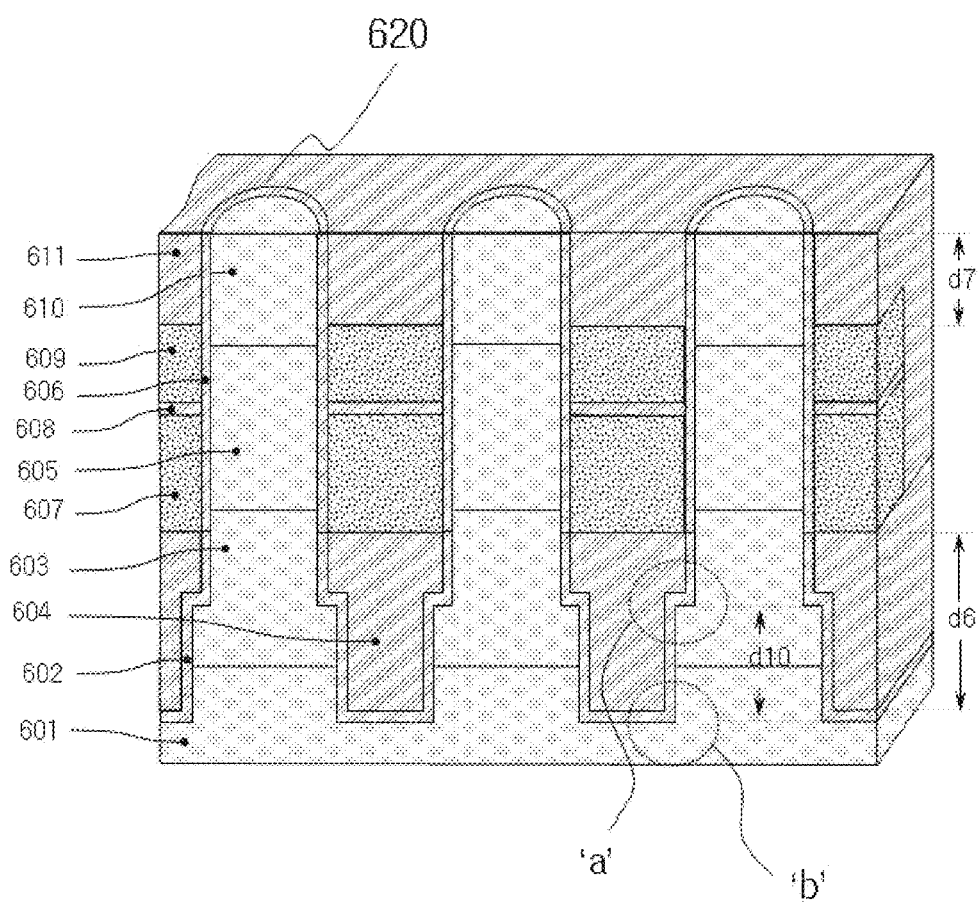
FIG. 6 is a perspective cross-sectional view taken along line A-A', that is, a word line of FIG. 5 in a DRAM cell array implemented by using the pillar-type FETs according to the first embodiment of the present invention.
Figure 7:
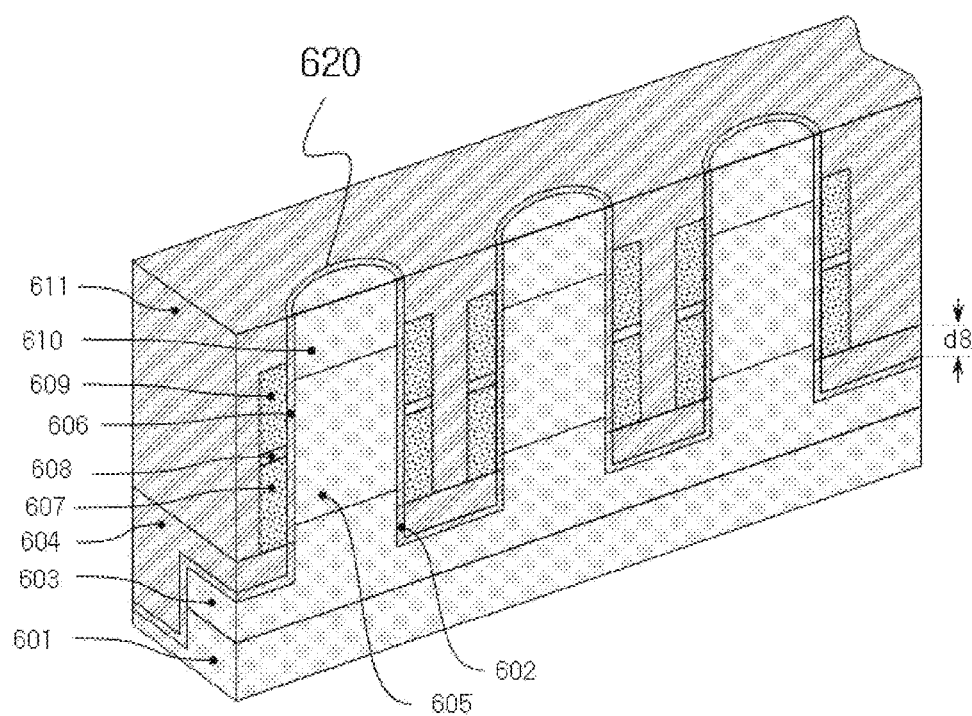
FIG. 7 is a perspective cross-sectional view taken along line B-B', that is, a bit line of FIG. 5 in the DRAM cell array implemented by using the pillar-type FETs according to the first embodiment of the present invention.
Figure 8:
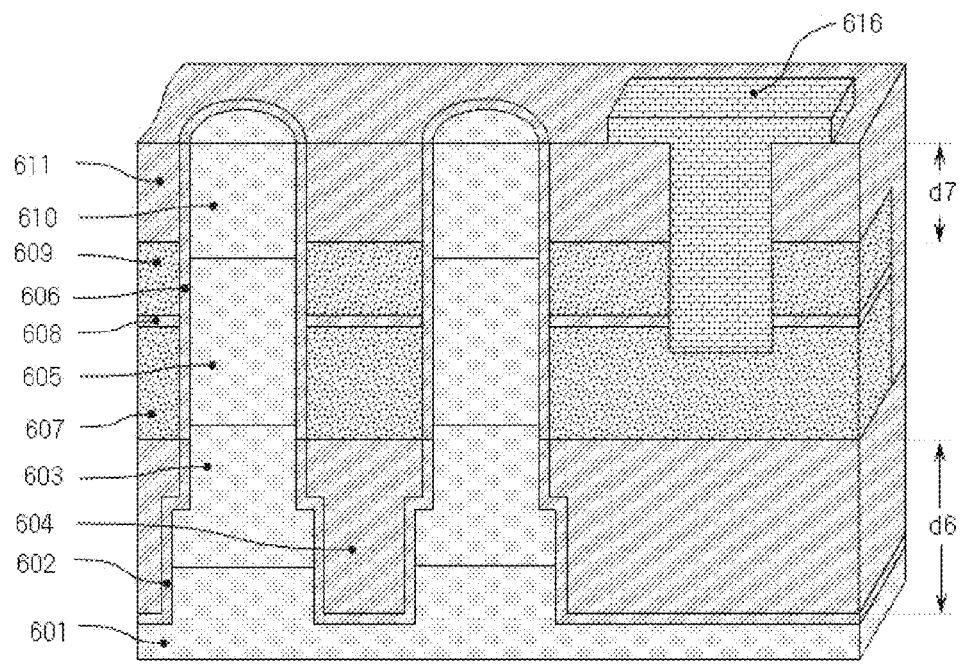
FIG. 8 is a perspective cross-sectional view illustrating an example of a structure for electrically connecting gate electrodes having different work functions in the DRAM cell array implemented by using the pillar-type FETs according to the first embodiment of the present invention.

FIGS. 6 to 8 illustrate examples of the DRAM cell array using the pillar-type FETs according to the present invention. The DRAM cell array is implemented on a bulk silicon substrate. Alternatively, as described above, the DRAM cell array may be implemented on an SOI substrate.

FIG. 6 is a perspective cross-sectional view taken along line A-A', that is, a word line of FIG. 5. The DRAM cell array shown in FIG. 6 is implemented by using the pillar-type FETs according to the first embodiment. It should be noted that the DRAM cell array can be implemented by using the pillar-type FETs shown in FIGS. 2, 3, and 4. Each pillar-type FET includes a light-doped p-type silicon substrate 601, a good-quality insulating layer 602, an insulating layer 604 for isolation of cell device, a source region 603, a gate insulating layer 606, a first gate electrode 607, an inter-gate insulating layer 608, a second gate electrode 609, a drain region 610, and a third insulating layer 611. In FIG. 6, as an example, three semiconductor pillars 620 are disposed in the word line direction. Although the first gate electrode 607 and the second gate electrode 609 seems to be separated by the inter-gate insulating layer 608, the first gate electrode 607 and the second gate electrode 609 are eclectically connected to each other through a process for forming a word line contact and an interconnection line. The first gate electrode 607, the inter-gate insulating layer 608, and the second gate electrode 609 of the gate electrode are connected to each other in the word line direction. In the above example, the source regions 603 of the three semiconductor pillars 620 are different bit lines and electrically isolated from each other by the first insulating layers 602 and the second insulating layers 604. In ensure the electrical isolation between the bit lines, as shown in FIG. 6, trenches denoted by reference numeral d10 may be further formed in the bottoms of the semiconductor pillars 620, an insulating layer may be filed therein, and a doping concentration of p-type impurities of the p-type semiconductor substrate 601 contacting with a bottom of the first insulating layer 602 may be selectively increased.

In FIG. 6, the source 603 includes two regions having different widths. A corner region (a region 'a' in FIG. 6) between the two regions having different widths may be formed with an arbitrary angle, preferably, formed to be rounded. In FIG. 6, a corner region (a region 'b' in FIG. 6) between the semiconductor substrate 601 and the semiconductor pillar 620 having a large width may also be formed with an arbitrary angle, preferably, formed to be rounded.

After the semiconductor pillar is formed on the semiconductor substrate, the first insulating layer 602 for protection and insulation of an exposed silicon surface is formed with a thickness of 0.5 nm to 50 nm. Next, the second insulating layer 604 having a larger thickens of 10 nm to 500 nm is formed on the first insulating layer 602. In FIG. 6, a thickness d6 of the second insulating layer 604 in the vertical direction is defined to be in a range of 15 nm to 500 nm. In FIG. 6, the third insulating layer 611 is also provided for electrical insulation. A thickness d7 of the third insulating layer 611 in the vertical direction is defined to be in a range of 5 nm to 700 nm.

FIG. 7 is a perspective cross-sectional view taken along line B-B', that is, a bit line of FIG. 5. As an example, three semiconductor pillars 620 are disposed in the bit line direction. The first gate electrode 607 and the second gate electrode 609 formed in the semiconductor pillar 620 are electrically isolated from each other.

However, the source regions 603 of the semiconductor pillars 620 are connected to each other in the bit line direction through the $n^+$-doped source regions 603 formed under the semiconductor pillars 620. In order to reduce parasitic capacitance of the bit lines, a concentration of the p-type silicon substrate needs to be lowered. The second insulating layer 604 of FIG. 7 is the same as the second insulating layer of FIG. 6. In FIG. 6, the thickness of the second insulating layer 604 for electrical isolation between the bit lines is denoted by reference numeral d6, and in FIG. 7, the thickness of the second insulating layer 604 formed on the bit lines connected along the $n^+$-doped sources 603 is denoted by reference numeral d8 which is relatively small and defined to be in a range of 10 nm to 400 nm.

FIG. 8 is a perspective cross-sectional view taken along a word line, similarly to FIG. 6. As described above, FIG. 8 illustrates electrical connection between the first gate electrode 607 and the second gate electrode 609. In a process for forming a word line contact and an interconnection line 616, as shown in FIG. 8, a contact 616 is formed to penetrate the second gate electrode 609 and the inter-gate insulating layer 608 to the first gate electrode 607 so that the first gate electrode 607 and the second gate electrode 609 can be electrically connected to each other.

Figure 9:
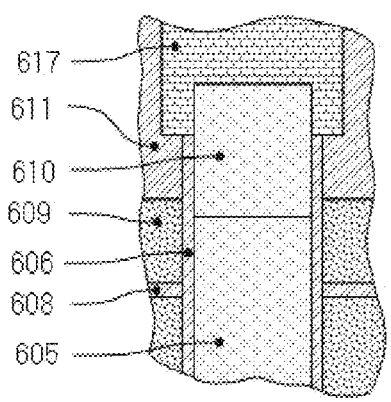
FIG. 9 illustrates cross-sectional views of structures for reducing resistance of a drain or source region in a pillar-type FET according to the present invention, (a) is a cross-sectional view of a structure where a contact area is increased so as to reduce contact resistance of an electrode contacting with the drain region, and (b) is a cross-sectional view of a structure where a selective epitaxial layer is grown so as to reduce resistance of the drain region.
Figure 9:
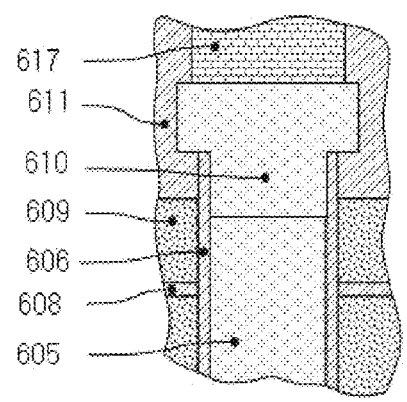

FIG. 9 illustrates a structure for reducing parasitic resistance in a pillar-type FET where a drain region or a source region formed in an upper portion of the semiconductor pillar 620 is connected to a metal interconnection line or an electrode. FIG. 9 (a) illustrates a structure where an upper surface of the drain region or the source region formed in the semiconductor pillar 620 and a portion of a side wall thereof are in contact with an interconnection electrode 617 so as to reduce a contact resistance by increasing a contact area between the drain region or the source region formed in the semiconductor pillar 620 and the interconnection electrode 617. FIG. 9 (b) illustrates a structure for reducing the parasitic resistance by increasing a cross-sectional area of a portion of the drain region or the source region formed in the semiconductor pillar 620 excluding a vicinity of the gate electrode. The structure may be implemented by using the selective epitaxial layer growth.

Figure 10:
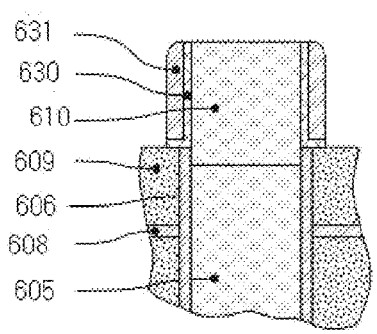
FIG. 10 illustrates cross-sectional views of main processes in case of growing the selective epitaxial layer shown in FIG. 9 (b)
Figure 10:
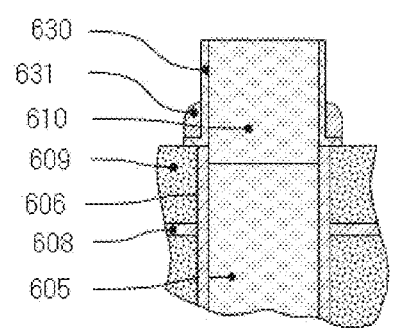
Figure 10:
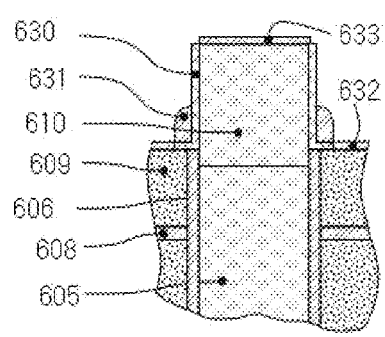
Figure 10:
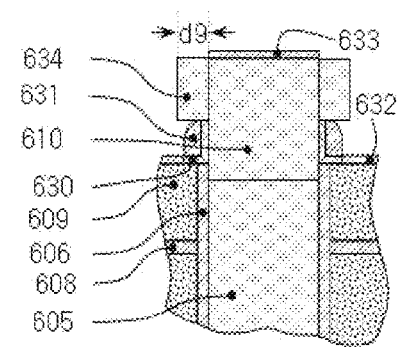

Hereinafter, processes for forming the structure shown in FIG. 9 (b) will be described with reference to cross-sectional views sequentially shown in FIG. 10. FIG. 10 sequentially illustrates the cross-sectional views of the processes for forming the structure shown in FIG. 9 (b). It is assumed that the first gate electrode 607 is made of p$^+$ polysilicon, and the second gate electrode 609) is made of n$^+$ polysilicon. In the initial process, the first and second gate electrodes 607 and 609 are formed in advance. Next, the main processes will be described. For the convenience of description, it is assumed that a region formed in an upper portion of the semiconductor pillar 620 is the drain region 610. After the first and second gate electrodes 607 and 609 are formed, an insulating layer formed on a surface of the semiconductor pillar 620 where the drain region 610 is formed is removed, and a thin nitride layer 630 is formed. An insulating layer is deposited thereon, and an anisotropic etching process is performed to form an insulating layer spacer 631. In addition, an anisotropic etching process is performed on the exposed nitride layer, so that the product shown in FIG. 10 (a) is obtained. If the insulating layer spacer 631 is further selectively etched, a height of the spacer 631 is lower than a height of the drain region 610 protruding over the second gate electrode 609 as shown in 10 (b), and a portion of a side surface of the nitride layer 630 is exposed.

If the exposed drain region 610 or the polysilicon gate electrode is slightly oxidized, the product shown in FIG. 10 (c) is obtained. If the exposed nitride layer 630 on the side surface of the drain region 610 is selectively removed, a portion of the side surface of the drain region 610 is exposed. The exposed drain region corresponds to a silicon seed necessary for selective epitaxial layer growth. If the selective epitaxial layer growth is performed by using the exposed drain region 610 as a seed, a structure similar to a cross section shown in 10 (d). A thickness d9 of the grown epitaxial layer is defined to be in a range of 2 nm to 100 nm.

Although the above description is mainly made on implementation of the present invention by using the bulk silicon substrate, the device according to the present invention may be implemented by using an SOI substrate as well as the bulk silicon substrate. In case of using the SOI substrate, electrical isolation between the bit lines can surely obtained. In addition, sensing margin can be increased by reducing parasitic capacitance of an arbitrary bit line. However, the SOI substrate is expensive, and a density of defects of the SOI substrate is higher than that of the bulk silicon substrate.

According to the present invention, GIDL can be greatly reduced in a state that a threshold voltage of device in a pillar-type FET having a high degree of integration is suitably increased, so that an off-state current can be reduced. In addition, the off-state current can be reduced by using a change in cross-sectional area of a semiconductor pillar and a change in thickness of a gate insulating layer.

Figure 11:
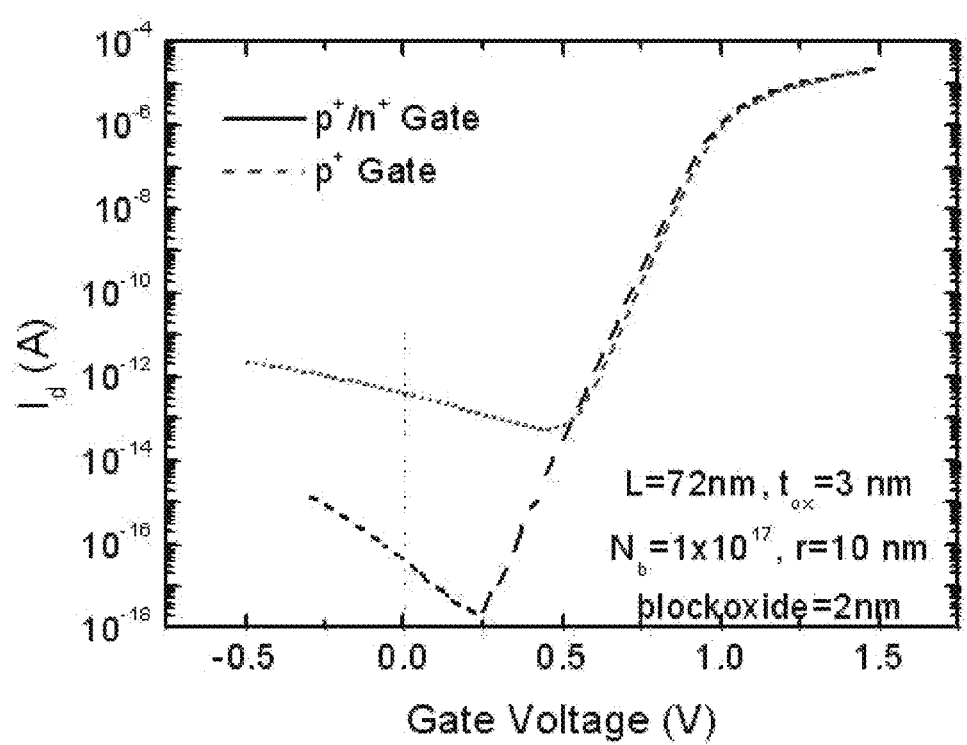
FIG. 11 is a graph illustrating I-V characteristics of a pillar-type FET device having a gate electrode structure of p+/n+ polysilicon according to the first embodiment of the present invention and a device having a gate electrode structure of p+ polysilicon.

FIG. 11 is a graph illustrating effects of the structure of the pillar-type FET according to the first embodiment of the present invention. The graph shown in FIG. 11 is a result of three-dimensional device simulation for a pillar-type device structure having a gate electrode including a first gate electrode having a high work function and a second gate electrode having a low work function according to the first embodiment. In the device simulation, the first gate electrode 107 is defined to be p$^+$ polysilicon, and the second gate electrode 109 is defined to be n$^+$ polysilicon. For the comparison, a result of device simulation in a case where both of the gate electrodes 7 and 9 are p$^+$ polysilicon is obtained. A radius of the semiconductor pillar 120 is defined to be 10 nm, a concentration of the body 105 is defined to be $10^{17}$ cm$^{-3}$, and the gate insulating layer 106 is defined to be a silicon oxide layer having a thickness of 3 nm. A length of the first gate electrode 107 is defined to be 50 nm, a length of the second gate electrode 109 is defined to be 20 nm, and a length of the inter-gate insulating layer 108 formed between the two electrodes is defined to be 2 nm. In a range where the gate voltage is larger than about 0.6 V, I-V characteristics of the two cases are similar to each other, and thus, on-state currents thereof are similar to each other. In the case where the gate electrodes are made of only the p$^+$ polysilicon, the off-state current in the off state that the gate voltage is 0V is about 1 pA due to the so-called GIDL, and a ratio of on/off-state currents slightly exceeds about $10^7$. However, according to the present invention, the off-state current is about 0.1 fA, and the ratio of on/off-state currents exceeds $10^{11}$. Therefore, according to the present invention, excellent characteristics can be obtained in comparison with a conventional case, and retention characteristics of cells can be greatly improved.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:
1. A pillar-type field effect transistor having low leakage current, comprising:
   a substrate;
   a semiconductor pillar formed substantially perpendicular to the substrate, the semiconductor pillar being elongated in a direction substantially perpendicular to the substrate and having a length substantially perpendicular to the substrate, the semiconductor pillar forming along the length of the semiconductor pillar a source region at one end thereof, a drain region at the other end thereof, and a semiconductor body between the source region and the drain region;
   a gate insulating layer formed around the semiconductor pillar along the length thereof;
   a gate electrode formed around the gate insulating layer, the gate electrode being divided into a first gate electrode and a second gate electrode along the length of the semiconductor pillar,
   wherein one of the first gate electrode and the second gate electrode is a source-side gate electrode, the other one thereof is a drain-side gate electrode electrically connected to the source-side gate electrode, and the drain-side gate electrode has a work function smaller than that of the source-side gate electrode to thereby reduce a gate-induced-drain leakage.

2. The pillar-type field effect transistor of claim 1, further comprising a third gate electrode between the first gate electrode and the second gate electrode.

3. The pillar-type field effect transistor of claim 2, further comprising inter-gate insulating layers formed between the first gate electrode and the third gate electrode, and between the third gate electrode and the second gate electrode.

4. The pillar-type field effect transistor of claim 1, wherein a cross-sectional area of the semiconductor body surrounded by the second gate electrode is smaller than that of the semiconductor body surrounded by the first gate electrode.

5. The pillar-type field effect transistor of claim 1, wherein a cross-sectional area of the semiconductor pillar is varied with the length of the semiconductor pillar.

6. The pillar-type field effect transistor of claim 1, wherein the first gate electrode and the second gate electrode are formed of a same material with different impurity doping types, different materials, or different materials with different impurity doping types.

7. The pillar-type field effect transistor of claim 1, wherein a thickness of the gate insulating layer formed under the second gate electrode is larger than that under the first gate electrode.

8. The pillar-type field effect transistor of claim 1, wherein each of the source region and the drain region is partially overlapped with the gate electrode.

9. The pillar-type field effect transistor of claim 1, further comprising a contact window for reducing contact resistance between the drain region and a drain electrode, wherein the contact window has an area wider than a cross-sectional area of the semiconductor pillar.

10. The pillar-type field effect transistor of claim 1, further comprising a selective epitaxial layer formed on a surface of the semiconductor pillar where the drain region is formed, wherein a total cross-sectional area of the semiconductor pillar where the drain region and the selective epitaxial layer are formed is wider than a cross-sectional area of the semiconductor body where the gate electrode is formed.

11. The pillar-type field effect transistor of claim 1, wherein the semiconductor pillar is formed by patterning a bulk semiconductor substrate or an SOI (Silicon on Insulator) substrate.

12. The pillar-type field effect transistor of claim 1, further comprising an inter-gate insulating layer is formed between the first gate electrode and the second gate electrode.

13. The pillar-type field effect transistor of claim 12, wherein the first gate electrode and the second gate electrode are electrically connected to each other by a contact or metal interconnection line.

14. The pillar-type field effect transistor of claim 12, wherein a cross-sectional area of the semiconductor body surrounded by the second gate electrode is smaller than that of the semiconductor body surrounded by the first gate electrode.

15. The pillar-type field effect transistor of claim 12, wherein a cross-sectional area of the semiconductor pillar is varied with the length of the semiconductor pillar.

16. The pillar-type field effect transistor of claim 12, wherein a thickness of the gate insulating layer formed under the second gate electrode is larger than that of the gate insulating layer formed under the first gate electrode.

17. The pillar-type field effect transistor of claim 12, wherein the first gate electrode and the second gate electrode are formed of a same material with different impurity doping types, different materials, or different materials with different impurity doping types.

* * * * *